(12) United States Patent
Meguro et al.

(10) Patent No.: US 10,884,328 B2
(45) Date of Patent: Jan. 5, 2021

(54) PROJECTION DISPLAY APPARATUS

(71) Applicant: SONY CORPORATION, Tokyo (JP)

(72) Inventors: Hiroyuki Meguro, Kanagawa (JP); Masahiro Ishige, Kanagawa (JP); Ryo Kusui, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/310,960

(22) PCT Filed: Jun. 28, 2017

(86) PCT No.: PCT/JP2017/023688
§ 371 (c)(1),
(2) Date: Dec. 18, 2018

(87) PCT Pub. No.: WO2018/042849
PCT Pub. Date: Mar. 8, 2018

(65) Prior Publication Data
US 2020/0033705 A1    Jan. 30, 2020

(30) Foreign Application Priority Data
Aug. 30, 2016 (JP) .................................. 2016-167894

(51) Int. Cl.
*G03B 21/16* (2006.01)
*G03B 21/20* (2006.01)
(Continued)

(52) U.S. Cl.
CPC ........... *G03B 21/16* (2013.01); *G03B 21/145* (2013.01); *G03B 21/204* (2013.01); *H05K 7/20136* (2013.01); *H04N 9/3144* (2013.01)

(58) Field of Classification Search
CPC ..... G03B 21/16; G03B 21/204; H04N 9/3144
(Continued)

(56) References Cited

U.S. PATENT DOCUMENTS 9,052,582 B2 * 6/2015 Komatsu ................. F21V 14/08
2004/0263796 A1   12/2004 Russell et al.
(Continued)

FOREIGN PATENT DOCUMENTS

EP        1 860 496 A1   11/2007
JP        10-90811 A      4/1998
(Continued)

OTHER PUBLICATIONS

International Search Report dated Sep. 19, 2017, in PCT/JP2017/023688, filed Jun. 28, 2017.
(Continued)

*Primary Examiner* — Ryan D Howard
(74) *Attorney, Agent, or Firm* — Oblon, McClelland, Maier & Neustadt, L.L.P.

(57) ABSTRACT

A projection display apparatus according to an embodiment of the present disclosure includes: a light source optical system including a light source section, a light conversion section that converts light emitted from the light source section to light having a wavelength band different from a wavelength band of the emitted light, and a cooling section that cools the light conversion section; and an external casing that houses the light source optical system and has an air inlet and an air outlet that form an airflow path in a linear shape. The light source section and the light conversion section are disposed on the airflow path, and the cooling section is disposed at a position shifted from the airflow path.

13 Claims, 6 Drawing Sheets

(51) Int. Cl.
*H04N 9/31* (2006.01)
*G03B 21/14* (2006.01)
*H05K 7/20* (2006.01)

(58) Field of Classification Search
USPC .................................................... 353/60–61
See application file for complete search history.

(56) References Cited

U.S. PATENT DOCUMENTS

| | | |
|---|---|---|
| 2006/0012757 A1 | 1/2006 | Russell et al. |
| 2007/0273839 A1 | 11/2007 | Doi et al. |
| 2011/0096297 A1 | 4/2011 | Ogino et al. |
| 2012/0013854 A1 | 1/2012 | Nishimura et al. |
| 2015/0042963 A1 | 2/2015 | Nishimori et al. |

FOREIGN PATENT DOCUMENTS

| | | | |
|---|---|---|---|
| JP | 2011-95388 | A | 5/2011 |
| JP | 2012-13897 | A | 1/2012 |
| JP | 2012-181309 | A | 9/2012 |
| JP | 2014-92599 | A | 5/2014 |
| JP | 2014-211462 | A | 11/2014 |
| JP | 2015-36708 | A | 2/2015 |

OTHER PUBLICATIONS

Extended European Search Report dated Jul. 15, 2019 in European Patent Application No. 17845859.2, 7 pages.

\* cited by examiner

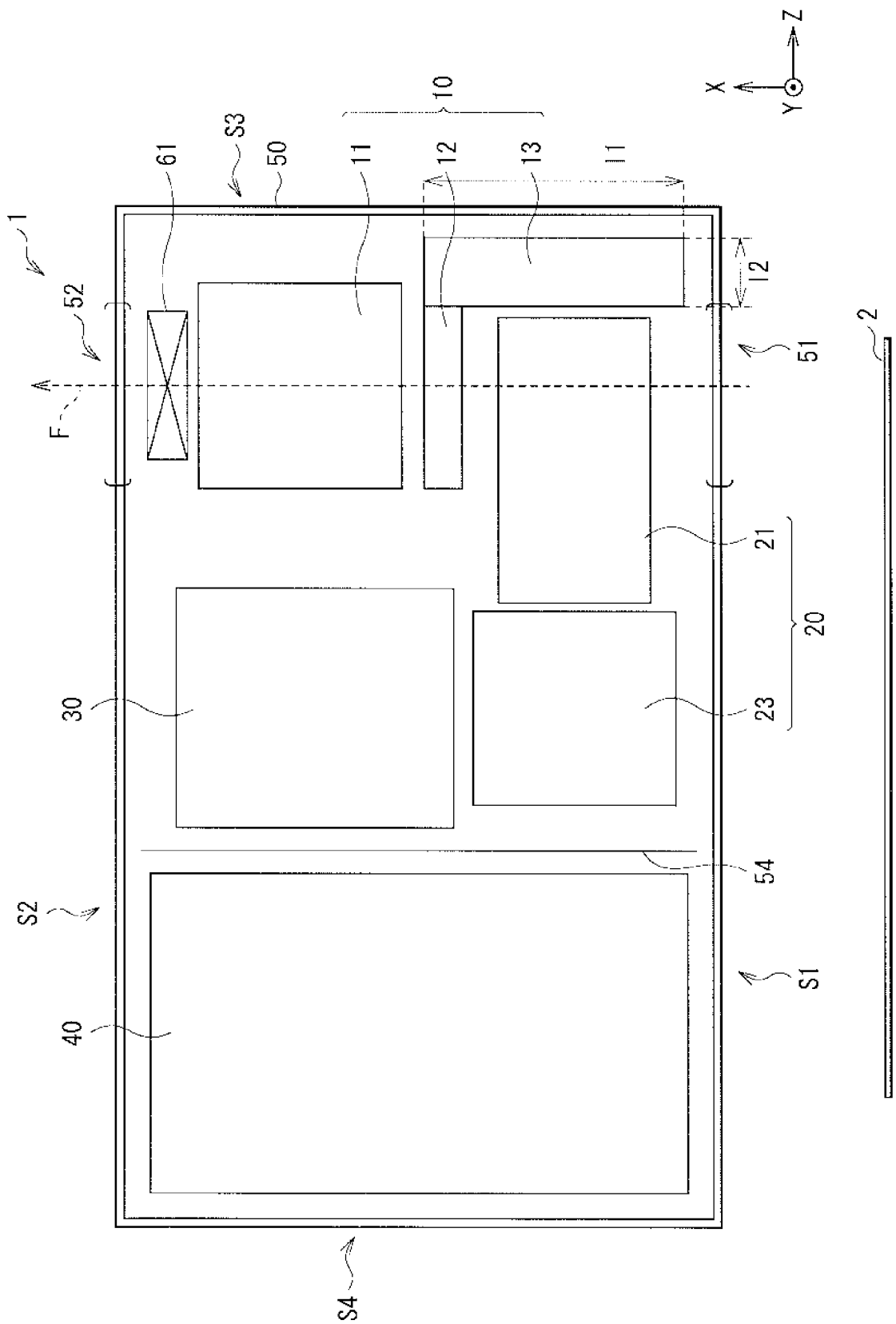
[FIG. 1]

[ FIG. 2A ]
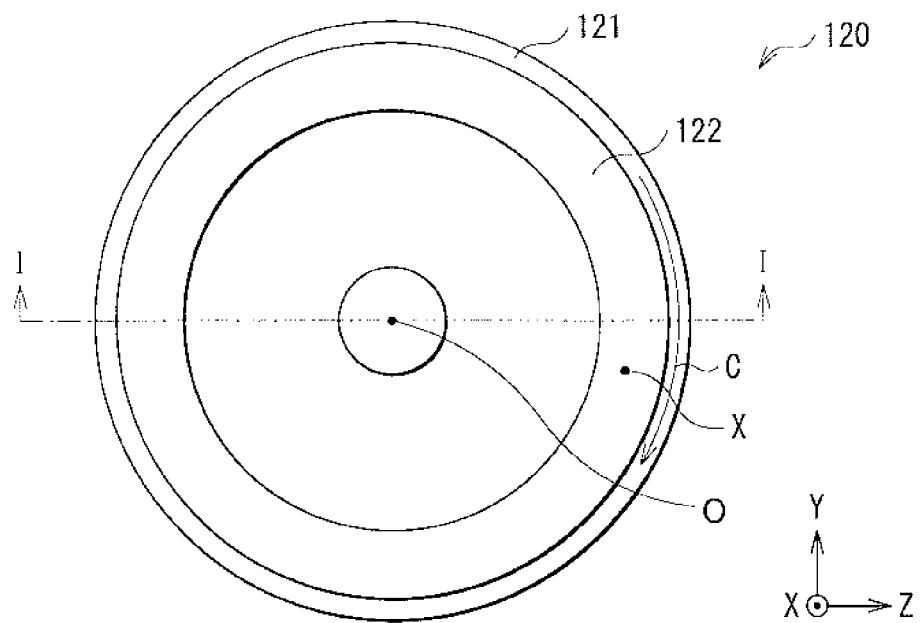
[ FIG. 2B ]
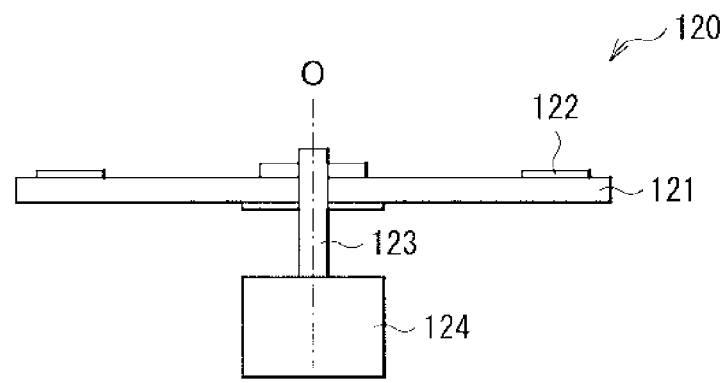

[ FIG. 3A ]
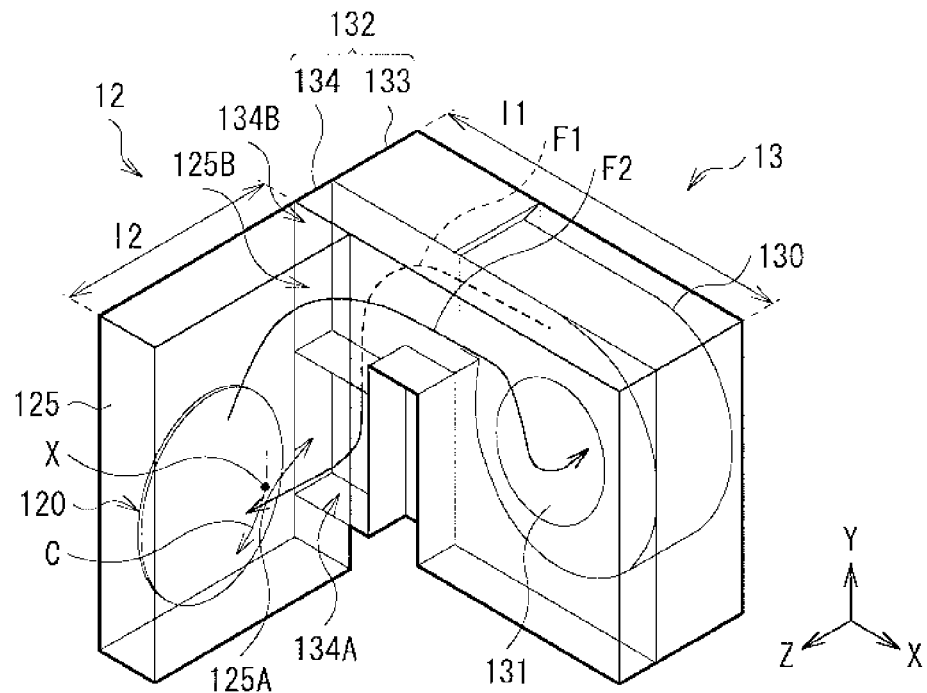
[ FIG. 3B ]
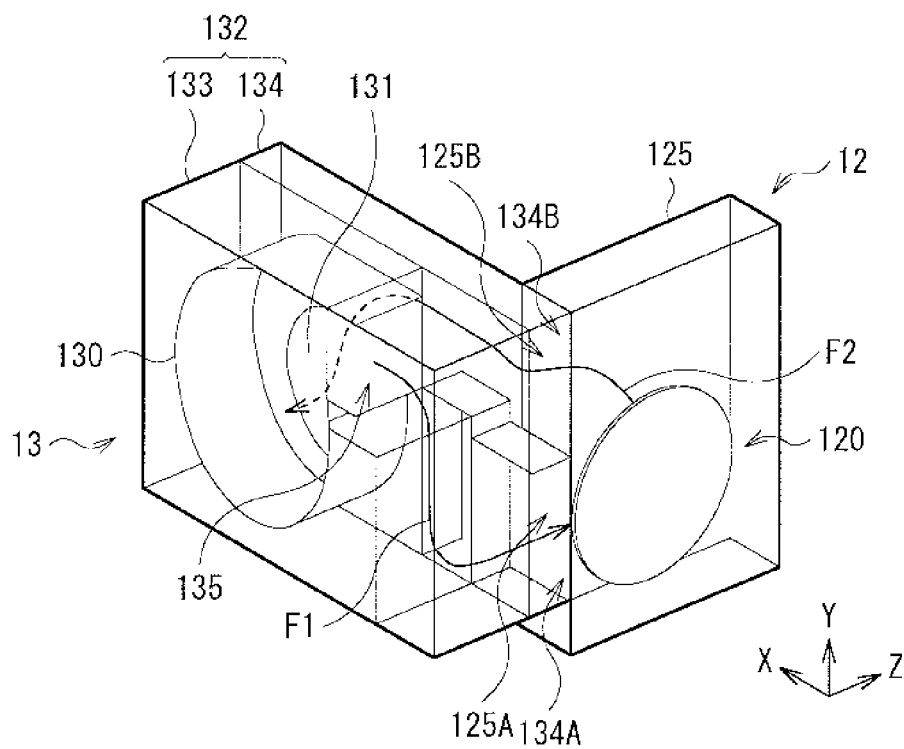

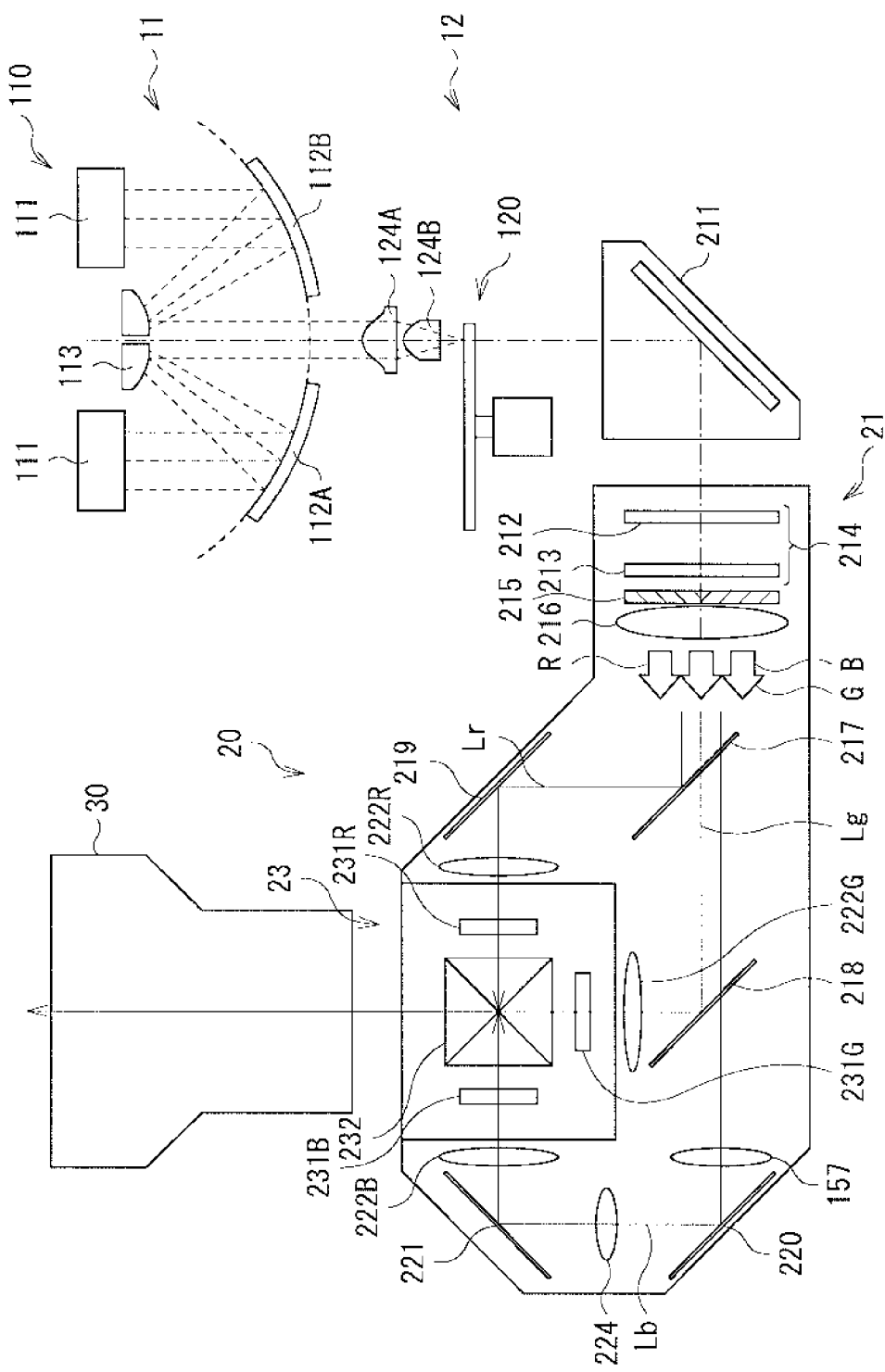
[FIG. 4]

[FIG. 5]
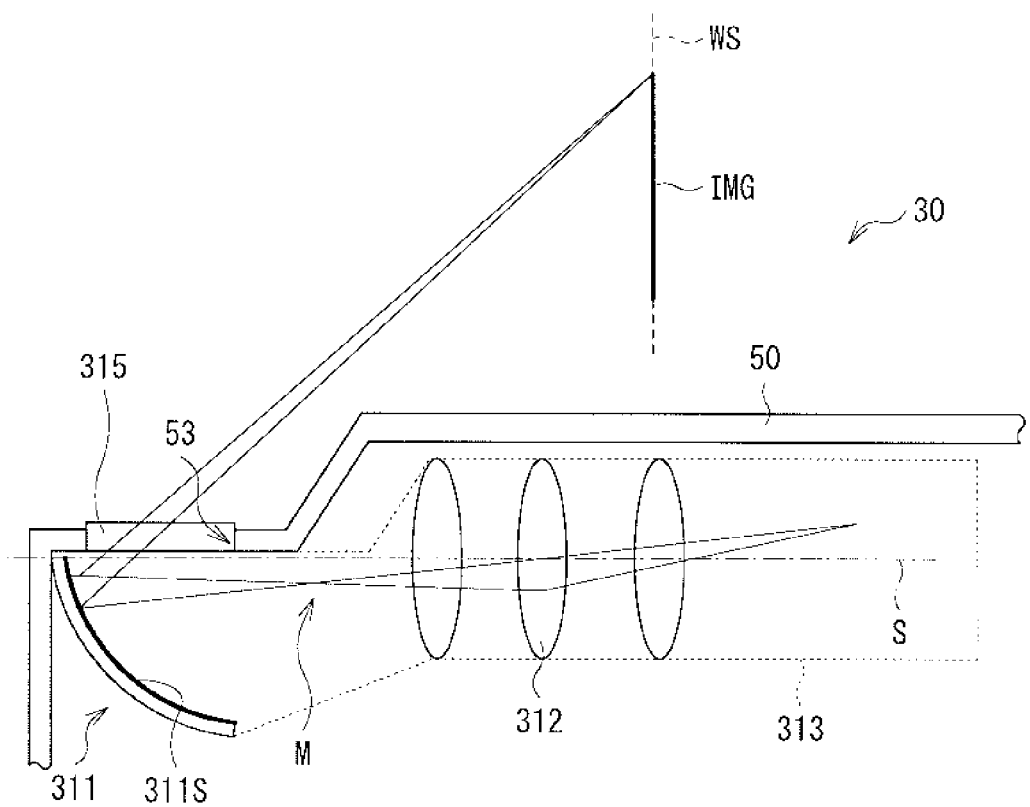

[ FIG. 6 ]
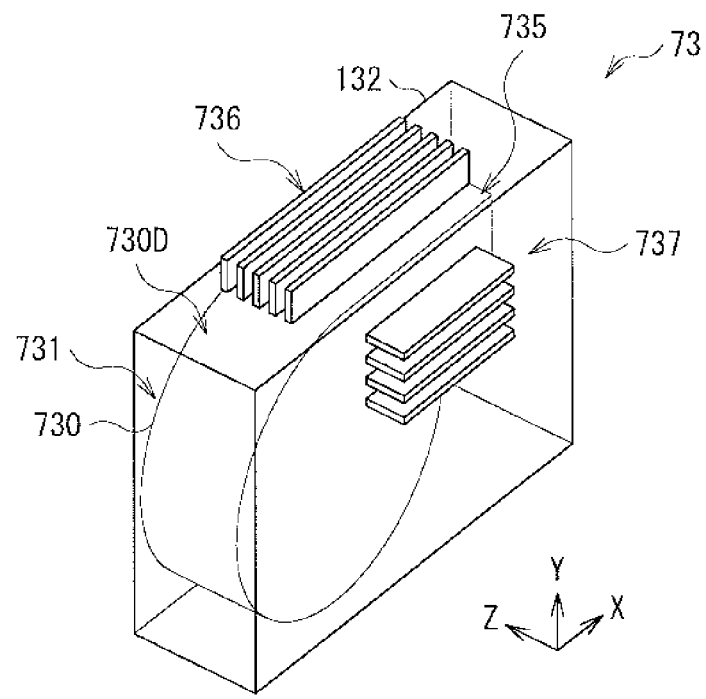
[ FIG. 7 ]
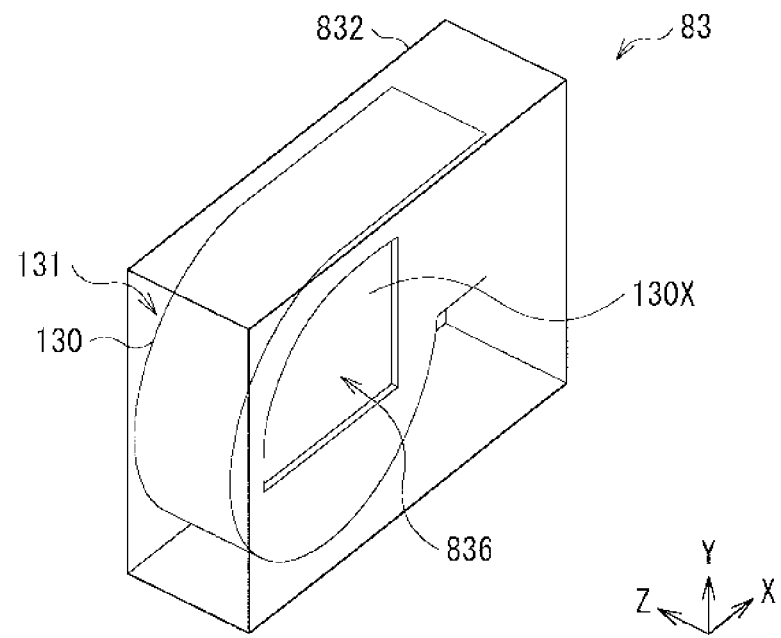

PROJECTION DISPLAY APPARATUS

TECHNICAL FIELD

The present disclosure relates to a projection display apparatus including a light conversion section and a cooling section.

BACKGROUND ART

A short-focus projector placed near a wall or on a table, etc. to project an image often has a product shape of a horizontally long rectangular parallelepiped. Moreover, as a component layout in the product, a projection lens is often disposed at a middle part thereof. In such a short-focus projector, in order to improve use efficiency of a space in the product, it is effective to dispose optical units from a light source lamp section to a projection lens section in a U-shape as with a front-projection liquid crystal display apparatus in PTL 1, for example.

With the short-focus projector having a configuration as described above, a heating value in the optical unit increases as being closer to a light source and decreases as being closer to the projection lens. For this reason, the light source is provided with a cooling fan or the like for the light source.

CITATION LIST

Patent Literature

PTL 1: Japanese Unexamined Patent Application Publication No. H10-90811

SUMMARY OF THE INVENTION

Incidentally, some of the short-focus projectors include, besides a light source, a light conversion section that converts light emitted from the light source into a different wavelength. Such a short-focus projector extracts white light as fluorescence by irradiating a phosphor with light from the light source such as a laser diode (Laser Diode: LD). An optical unit includes, for example, an excitation light source (light source section) that emits excitation light that excites the phosphor, and a phosphor wheel (light conversion section) having a phosphor layer that emits light of a wavelength different from that of the excitation light upon reception of the excitation light. In such an optical unit, the heating value from the light conversion section is the highest next to that from the light source section, for example. Thus, there is a need to improve cooling efficiency of the phosphor wheel including a vicinity of the phosphor wheel.

It is desirable to provide a projection display apparatus that makes it possible to improve a cooling efficiency.

A projection display apparatus according to an embodiment of the present disclosure includes: a light source optical system including a light source section, a light conversion section that converts light emitted from the light source section to light having a wavelength band different from a wavelength band of the emitted light, and a cooling section that cools the light conversion section; and an external casing that houses the light source optical system and has an air inlet and an air outlet that form an airflow path in a linear shape. The light source section and the light conversion section are disposed on the airflow path, and the cooling section is disposed at a position shifted from the airflow path.

In the projection display apparatus according to an embodiment of the present disclosure, the light source section and the light conversion section are disposed on the airflow path in a linear shape formed by the air inlet and the air outlet provided to the external casing, and the cooling section that cools the light conversion section is disposed at a position shifted from the airflow path. This makes it possible to reduce a pressure loss of the cooling section. It becomes also possible to exhaust heat from the light conversion section efficiently by air taken through the air inlet.

According to a projection display apparatus in an embodiment of the present disclosure, the light source section and the light conversion section are disposed on the airflow path in a linear shape, and the cooling section that cools the light conversion section is disposed at a position shifted from the airflow path, and thus the pressure loss of the cooling section is reduced. It becomes also possible to exhaust heat from the light conversion section efficiently by air taken through the air inlet. It is thus possible to improve the cooling efficiency.

It is to be noted that the effects described herein are not necessarily limited but may include any of the effects described in this specification.

BRIEF DESCRIPTION OF DRAWING

FIG. 1 is a block diagram illustrating an overall configuration of a projector according to an embodiment of the present disclosure.

FIG. 2A is a schematic plan view of a phosphor wheel.

FIG. 2B is a schematic cross-sectional view of the phosphor wheel illustrated in FIG. 2A.

FIG. 3A is a schematic diagram that describes flow of air in a housing part of each of the phosphor wheel and a cooling fan.

FIG. 3B is a schematic diagram for explaining the flow of air in the housing part of each of the phosphor wheel and the cooling fan.

FIG. 4 is an outline diagram illustrating an example of a configuration of the projector illustrated in FIG. 1.

FIG. 5 is an outline part illustrating an example of a configuration of a projection optical system 30.

FIG. 6 is a schematic diagram illustrating another example of a cooling fan according to Modification Example 1 of the present disclosure.

FIG. 7 is a schematic diagram illustrating another example of a cooling fan according to Modification Example 2 of the present disclosure.

MODES FOR CARRYING OUT THE INVENTION

In the following, embodiments of the present disclosure are described in detail with reference to the drawings. It is to be noted that description is made in the following order.
1. Embodiment (An example in which a cooling fan for a phosphor wheel is disposed at a position shifted from an airflow path)
 1-1. Configuration of Main Part
 1-2. Configuration of Projection Display Apparatus
 1-3. Workings and Effects
2. Modification Examples
 2-1. Modification Example 1 (An example in which fins are provided to the cooling fan)
 2-2. Modification Example 2 (An example in which a portion of a cooling fan is exposed from a casing)

1. First Embodiment

FIG. 1 illustrates an overall configuration of a projection display apparatus (projector 1) according to an embodiment of the present disclosure. The projector 1 is a projection display apparatus that projects an image (image light) on a screen 2 (projection surface) such as a wall surface. The projector 1 includes a light source optical system 10, an image generation system 20, a projection optical system 30, a power supply unit 40, and a casing 50 that houses these components. The light source optical system 10 includes, for example, a light source section 11, a light conversion section 12, and a cooling section 13 that cools the light conversion section 12.

1-1. Configuration of Main Part

In the projector 1 according to the present embodiment, the casing 50 is provided with an air inlet 51 that takes in air for cooling of an inside of the casing 50, and an air outlet 52 that discharges air inside the casing 50. The air inlet 51 is disposed in a surface that faces a screen 2 (rear surface S1, rear side), and the air outlet 52 is disposed in a surface that is opposed to the rear surface S1 (front surface S2, front side), both of which are disposed to be opposed to each other. This allows for formation of flow of air (a flow path F (airflow path)) proceeding straight in an X-axis direction (from the rear surface S1 toward the front surface S2) inside the casing 50.

The projector 1 includes the light source optical system 10, the image generation system 20, and the projection optical system 30 that are disposed in a U-shape. That is, the light source section 11 of the light source optical system 10 and the projection optical system 30 are disposed in proximity to each other. Moreover, an image IMG projected by the projection optical system 30 has substantially the same direction as light emitted from the light source section 11 configuring the light source optical system 10.

The light source section 11 and the light conversion section 12 configuring the light source optical system 10 are disposed between the air inlet 51 and the air outlet 52 that are disposed to be opposed to each other, in order of the light conversion section 12 and the light source section 11 from side of the air inlet 51. The cooling section 13 that cools the light conversion section 12 is disposed at a position shifted from the flow path F. Specifically, with reference to the light conversion section 12 on the flow path F, the cooling section 13 is disposed as shifted to a side opposite to the projection optical system 30. That is, the cooling section 13 is installed and disposed in proximity to a side surface S3 of the casing 50. Moreover, the cooling section 13 has a longitudinal direction l1 in a plan view, and is disposed to allow the longitudinal direction l1 to be substantially parallel to the flow path F.

Configurations of the light conversion section 12 and the cooling section 13 are described below in detail.

The light conversion section 12 includes a phosphor wheel 120 that converts the light emitted from the light source section 11 to light having a different wavelength band, and condensing lenses 124A and 124B that condense the light emitted from the light source section 11 to a predetermined position (luminous point X) of the phosphor wheel 120 (see FIGS. 2A, 2B, and 4).

FIG. 2A illustrates a planar configuration of the phosphor wheel 120, and FIG. 2B illustrates a cross-sectional configuration of the phosphor wheel 120 taken along line I-I. The phosphor wheel 120 includes a base part 121 in a disk shape, for example, and a phosphor layer 122 is disposed on the base part 121. A motor 124 is coupled to the base part 121 via a shaft 123, and the motor 124 enables the base part 121 to rotate in a direction of an arrow C around a rotational axis O passing through a center of the base part 121.

The phosphor layer 122 is excited by the light applied from the light source section 11 to generate fluorescence having a wavelength band different from the wavelength band of the light. In the present embodiment, the phosphor layer 122 includes a fluorescent substance that is excited by blue light Lb (blue laser light) having a central wavelength of about 445 nm to generate fluorescence, and converts the blue laser light Lb applied from the light source section 11 to yellow light Ly, for example, and outputs the yellow light Ly to side of the back surface (side of an illumination optical system 21) of the base part 121.

As the fluorescent substance included in the phosphor layer 122, for example, a YAG (yttrium aluminum garnet) based phosphor is used. It is to be noted that there is no limitation on the type of the fluorescent substance, the wavelength band of the excited light, and the wavelength band of visible light generated by the excitation.

The yellow light Ly emitted from the phosphor layer 122 is transmitted through the base part 121, and is outputted to the illumination optical system 21 (specifically, a reflecting mirror 211).

The cooling section 13 includes a cooling fan 130 that cools the light conversion section 12, specifically the luminous point X of the phosphor wheel 120. It is preferable to use, as the cooling fan 130, a sirocco fan that blows wind in a direction orthogonal to the rotational axis, for example.

In the present embodiment, the phosphor wheel 120 and the condensing lenses 124A and 124B that configure the light conversion section 12 and the cooling fan 130 that configures the cooling section 13 are preferably housed, respectively, in a casing 125 (first internal casing) and a casing 132 (second internal casing) as illustrated in FIGS. 3A and 3B. The casing 125 and the casing 132 both have a shape of a substantially rectangular parallelepiped, and are coupled to allow a longitudinal direction l2 of the casing 125 and the longitudinal direction l1 of the casing 132 to be orthogonal to each other. In other words, a planar direction (longitudinal direction l2) of the base part 121 of the phosphor wheel 120 that configures the light conversion section 12 and the longitudinal direction l1 of the cooling fan 130 that configures the cooling section 13 are disposed to form a substantially right angle with each other.

The casing 125 that houses the phosphor wheel 120 and the condensing lenses 124A and 124B has an opening 125A and an opening 125B to be coupled to the casing 132 on one of side surfaces thereof. The casing 132 has two spaces 133 and 134 separated by a partition wall 132A, and the cooling fan 130 is housed in the space 133. The space 134 is provided with two openings (a blowoff port 134A and a suction port 134B) to be coupled to the casing 125, thus forming an air blowing path for sending air (warm wind) warmed at the luminous point X on the phosphor wheel 120 to an air inlet 131 of the cooling fan 130 via the suction port 134B.

That is, in the present embodiment, the opening 125A of the casing 125 is joined to the blowoff port 134A of the casing 132, and the opening 125B of the casing 125 is joined to the suction port 134B of the casing 132. Thus, the light conversion section 12 and the cooling section 13 are housed in a sealed space. That is, cooling of the light conversion section 12 is sealed circulation cooling.

The flow of air in the sealed space is as described below. In the cooling section 13, as illustrated in FIGS. 3A and 3B, air (cold wind) blown from an air blowing port 135 of the cooling fan 130 is fed into the casing 125 through the blowoff port 134A of the casing 132 and the opening 125A coupled thereto, and cools the luminous point on the phosphor wheel 120. The air (warm wind) warmed at the luminous point X on the phosphor wheel 120 is suctioned into the air inlet 131 of the cooling fan 130 through the opening 125B of the casing 125 and the suction port 134B coupled thereto.

It is to be noted that the blowoff port 134A of the casing 132 and the opening 125A of the casing 125 coupled thereto are preferably formed to be positioned in proximity to the luminous point X of the phosphor wheel 120. This makes it possible to improve cooling efficiency of the luminous point X. Moreover, the opening 125B of the casing 125 and the suction port 134B of the casing 132 coupled thereto are preferably formed downstream of a rotational direction of the phosphor wheel 120 with reference to the luminous point X of the phosphor wheel 120, for example, on side above the blowoff port 134A of the casing 132 and the opening 125A of the casing 125 in a case where the phosphor wheel 120 rotates in the direction of the arrow C illustrated in FIG. 3A. This makes it possible to improve heat exhaust efficiency in the casing 125.

Moreover, in the casing 132 in which the cooling section 13 is housed, the longitudinal direction 11 preferably extends from the light conversion section 12 toward the air inlet 51. In other words, the casing 132 is preferably disposed in proximity to the side surface S3 of the casing 50. This makes it possible to effectively use the space in the casing 50 and thus to reduce the size of the projector 1.

Furthermore, the casing 125 in which the light conversion section 12 is housed is preferably disposed between the air inlet 51 and the air outlet 52 disposed to be opposed to each other, namely on the flow path F, to allow the longitudinal direction 12 of the casing 125 to be orthogonal to the flow path F. The casing 132 is preferably disposed to allow its longitudinal direction 11 to be substantially parallel to the side surface S3 of the casing 50 and the flow path F. This makes it possible to cool the light conversion section 12 without causing the air suctioned through the air inlet 51 to be blocked by the cooling section 13, thereby improving the cooling efficiency.

It is to be noted that the casing 125 is provided with an opening (not illustrated), through which the light emitted from the light source section 11 passes, on each of surfaces on side of the light source section 11 facing the luminous point X of the phosphor wheel 120 and on side of the illumination optical system 21. For example, a condensing lens or the like is fitted into the opening.

1-2. Configuration of Projection Display Apparatus

FIG. 4 is an outline diagram illustrating an example of a configuration of each of optical systems that configure the projector 1. The projector 1 according to the present embodiment includes, as described above, the light source optical system 10, the image generation system 20, and the projection optical system 30. The image generation system 20 includes an image generation element 23 that generates an image on the basis of applied light, and the illumination optical system 21 that applies the light emitted from the light source optical system 10 to the image generation element 23. The projection optical system 30 projects the image generated by the image generation element 23.

The light source section 11 includes, for example, a light source 111 including a plurality of LDs, and condensing mirrors 112A and 112B as well as a condensing mirror 113 as optical systems for condensing the light emitted from the light source 111 on the phosphor wheel 120. Moreover, although not illustrated in FIG. 4, for example, a blue light source or the like is included that emits the blue laser light Lb to form white light (Lw) by synthesizing therewith the light (yellow light Ly) emitted from the light conversion section 12.

The light source 111 is a blue LD that is able to oscillate the blue laser light Lb having a peak wavelength of emission intensity within a wavelength range from 400 nm to 500 nm, for example. In addition to the LD, other light sources such as an LED may be used as the light source 111. Moreover, the wavelength range is not limited to 400 nm to 500 nm within which the blue laser light Lb has the peak wavelength of the emission intensity, either.

The condensing mirrors 112A and 112B have a concave reflection surface that substantially collimates and condenses, on the condensing mirror 113, a flux of light emitted from a plurality of LDs disposed in the light source 111. The condensing mirror 113 reflects the light condensed by the condensing mirrors 112A and 112B to the phosphor wheel 120.

It is to be noted that the light source section 11 is housed in a casing (not illustrated) and that the casing in which the light source section 11 is housed is coupled to, for example, the casing 125 in which the phosphor wheel 120 or the like is housed.

The light conversion section 12 includes, as described above, the phosphor wheel 120, and the condensing lenses 124A and 124B that condense the light inputted from the light source section 11 to the predetermined position of the phosphor wheel 120. The phosphor wheel 120 and the condensing lenses 124A and 124B are housed in, for example, the casing 125.

The light inputted from the light source section 11 is applied to the predetermined position (luminous point X) of the phosphor layer 122 on the phosphor wheel 120 by the condensing lenses 124A and 124B. The phosphor layer 122 is excited by the light applied from the light source section 11, and generates fluorescence (e.g., the yellow light Ly) having a wavelength band different from the wavelength band of the light (e.g., the blue laser light Lb). That is, the phosphor layer 122 converts the blue laser light Lb applied from the light source section 11 to the yellow light Ly, and outputs the yellow light Ly to the side of the illumination optical system 21. It is to be noted that the yellow light Ly is synthesized with the blue laser light Lb emitted from the blue light source described above, and is outputted as the white light (Lw) to the side of the illumination optical system 21.

The illumination optical system 21 includes, as illustrated in FIG. 4, for example, the reflecting mirror 211, an integrator element 214, a polarization conversion element 215, and a condensing lens 216. The integrator element 214 includes a first fly-eye lens 212 including a plurality of microlenses arranged two-dimensionally and a second fly-eye lens 213 including a plurality of microlenses arranged to correspond to the respective microlenses on a one-to-one basis.

The light (parallel light) entering the integrator element 214 from the light source optical system 10 is divided into a plurality of light fluxes by the microlenses of the first fly-eye lens 212 to form an image on the corresponding one of the microlenses of the second fly-eye lens 213. Each of the microlenses of the second fly-eye lens 213 functions as a secondary light source, and applies, as incident light, a plurality of parallel light beams having uniform luminance to the polarization conversion element 215.

The integrator element 214, as a whole, has a function of arranging the incident light applied to the polarization conversion element 215 from the light source optical system 10 to have a uniform luminance distribution.

The polarization conversion element 215 has a function of aligning the polarization state of the incident light inputted via the integrator element 214 or the like. The polarization conversion element 215 outputs outgoing light including blue light B, green light G, and red light R via the condensing lens 216 or the like disposed on emission side of the light source optical system 10, for example.

The illumination optical system 21 includes dichroic mirrors 217 and 218, mirrors 219, 220, and 221, relay lenses 223 and 224, field lenses 222R, 222G, and 222B, liquid crystal light valves 231R, 231G, and 231B as image generation elements, and a dichroic prism 232.

The dichroic mirrors 217 and 218 have a property of selectively reflecting a color light beam in a predetermined wavelength band and transmitting light in other wavelength bands. With reference to FIG. 4, for example, the dichroic mirror 217 selectively reflects the red light R (Lr). The dichroic mirror 218 selectively reflects the green light G (Lg) among the green light G and the blue light B transmitted through the dichroic mirror 217. The remaining blue light B (Lb) is transmitted through the dichroic mirror 218. This causes the light (white light Lw) outputted from the light source optical system 10 is split into a plurality of color light beams having different colors.

The split red light Lr is reflected by the mirror 219 and collimated by passing through the field lens 222R, and thereafter enters the liquid crystal light valve 231R for modulation of the red light. The green light Lg is collimated by passing through the field lens 222G, and thereafter enters the liquid crystal light valve 231G for modulation of the green light. The blue laser light Lb passes through the relay lens 223 to be reflected by the mirror 220, and further passes through the relay lens 224 to be reflected by the mirror 221. The blue laser light Lb reflected by the mirror 221 is collimated by passing through the field lens 222B, and thereafter enters the liquid crystal light valve 231B for modulation of the blue laser light Lb.

The liquid crystal light valves 231R, 231G, and 231B are electrically coupled to an unillustrated signal source (e.g., a PC) that supplies an image signal containing image information. The liquid crystal light valves 231R, 231G, and 231B modulate the incident light for each pixel on the basis of the supplied image signal of each color, and generate a red image, a green image, and a blue image, respectively. The modulated light beams of respective colors (formed images) are inputted to and synthesized in the dichroic prism 232. The dichroic prism 232 superimposes the light beams of respective colors inputted from three directions to synthesize the color beams, and outputs the resulting light toward the projection optical system 30.

FIG. 5 illustrates a configuration of the projection optical system 30. The projection optical system 30 includes, for example, one or two or more lenses 312 for projection and a concave mirror 311 in order from incident side, and projects the image IMG on a wall surface WS, for example, using the incident light. It is to be noted that the wall surface WS corresponds to a screen 2 disposed on side of the rear surface S1 of the projector 1 in FIG. 1, for example.

The lenses 312 are symmetric optical systems disposed on the same central axis S, and housed in a lens barrel 313, for example. The lenses 312 are lenses that project (magnify and project), on the wall surface WS, illumination light (image light) modulated by the image generation element 23. The lenses 312 form an intermediate image M in front of the concave mirror 311. A position where the intermediate image M is formed may be either between the lenses 312 and the concave mirror 311 or inside the lenses 312 as long as the position is in front of the concave mirror 311.

The projection optical system 30 further includes a transparent flat plate 315 including glass or the like on an optical path of the light reflected by the concave mirror 311. The projection optical system 30 is housed in, for example, the casing 50. It is to be noted that the concave mirror 311 may be housed in the lens barrel 313 together with the lenses 312. The casing 50 has an opening 53 on the optical path of the light reflected by the concave mirror 311, and the transparent flat plate 315 is so disposed tightly as to seal the opening 53.

It is preferable that the transparent flat plate 315 extends substantially parallel to the central axis S of the lenses 312. Moreover, a center of gravity of the transmitted flux on the incident side and a center of gravity of the transmitted flux on the emission side of the transparent flat plate 315 are each desirably disposed at a distance shorter than 4.6 times a focal length f of the projection optical system 30 from the central axis S of the lenses 312.

The projection optical system 30 according to the present embodiment projects the light from the concave mirror 311, as the image IMG, on the wall surface WS (e.g., the screen 2) that is a projection plane intersecting a plane on which the casing 50 is installed (e.g., a projection plane perpendicular to a footprint of the casing 50).

The power supply unit 40 includes a plurality of elements. These elements are built into a metallic shield case (not illustrated), for example, thus preventing electric and magnetic noises to be generated from leaking to the outside. The power supply unit 40 is disposed along, for example, either left or right side surface in the casing 50 (in FIG. 1, a side surface S4), and partitioned from the light source optical system 10, the image generation system 20, the projection optical system 30, and the power supply unit 40 by a partition plate 54, for example. It is to be noted that the partition plate 54 partitions the inside of the casing 50 into a region where the power supply unit 40 is disposed and a region where the above-described optical systems are disposed. The partition plate 54 either may have, for example, respective spaces between its both ends and the rear surface S1 and the front surface S2 as illustrated in FIG. 1, or may completely divide the space in the casing 50 with the respective both ends of the partition plate 54 in contact with the rear surface S1 and the front surface S2.

The casing 50 has, for example, a shape of a substantially rectangular parallelepiped, and includes, for example, the rear surface S1 facing the screen 2, the front surface S2 opposed to the rear surface S1, and side surfaces S3 and S4 disposed to be opposed to each other between the rear surface S1 and the front surface S2. It is to be noted that a surface on which a viewer sees the image IMG projected by the projector 1 is defined as the front surface S2 (front side) and that side on which the image IMG is projected is defined as the rear surface S1 (rear side). As described above, the rear surface S1 is provided with the air inlet 51, and the front surface S2 is provided with the air outlet 52 at a position opposed to the air inlet 51.

It is to be noted that the air inlet 51 and the air outlet 52 are disposed in positions shifted from the middle part of the casing 50. Specifically, the air inlet 51 and the air outlet 52 are disposed in positions where the light source section 11 and the light conversion section 12 of the light source optical system 10 are disposed between the air inlet 51 and the air outlet 52 when the light source optical system 10, the image generation system 20, the projection optical system 30, and the power supply unit 40 described above are housed. Moreover, the air inlet 51 and the air outlet 52 may not be disposed in positions completely opposed to each other, as long as the flow path F in a linear shape flowing from the rear side (rear surface S1) to the front side (front surface S2) is formed.

For example, an exhaust fan 61 is installed between the light source section 11 and the air outlet 52. In the projector 1, the exhaust fan 61 suctions air from the air inlet 51 to cool the light conversion section 12 and the light source section 11. Moreover, in the projector 1, the exhaust fan 61 exhausts air warmed by the light conversion section 12, the light source section 11, and the like in the casing 50 to the outside via the air outlet 52.

It is to be noted that there is no need for the air inlet 51 to be provided on the rear surface S1 and for the air outlet 52 to be provided on the front surface S2; the air inlet 51 may be provided on the front surface S2 and the air outlet 52 may be provided on the rear surface S1. In a case where the air outlet 52 is provided on the side of the rear surface S1, however, the image IMG to be projected may possibly be disturbed by the air exhausted from the air outlet 52. For this reason, it is preferable that the flow path F have a flow from the rear side toward the front side, and that the air inlet 51 be provided on the rear surface S1 and the air outlet 52 be provided on the front surface S2 as illustrated in FIG. 1.

1-3. Workings and Effects

As described above, as the optical units, in the projection display apparatus including, for example, the excitation light source (light source section) that emits excitation light that excites the phosphor and the phosphor wheel (light conversion section) having the phosphor layer that emits light of a wavelength different from that of the excitation light upon reception of the excitation light, the light source section has the highest heating value and the light conversion section has the second highest heating value. Thus, there is a need to improve cooling efficiency of the phosphor wheel including a vicinity of the phosphor wheel.

To address this issue, in the projector 1 according to the present embodiment, the light source section 11 and the light conversion section 12 are disposed on the flow path F in a linear shape connecting between the air inlet 51 and the air outlet 52 provided to the casing 50, and the cooling section 13 that cools the light conversion section 12 is disposed in the position shifted from the flow path F. This makes it possible to reduce a pressure loss of the cooling section 13. It becomes also possible to efficiently exhaust heat from the light conversion section 12 by air taken through the air inlet 51.

As described above, in the present embodiment, the light source section 11 and the light conversion section 12 are disposed on the flow path F in a linear shape formed in the casing 50. Furthermore, the cooling section 13 that cools the light conversion section 12 is disposed in the position shifted from the flow path F. This makes it possible to reduce a pressure loss of the cooling section 13 and also to efficiently exhaust heat from the light conversion section 12 by air taken through the air inlet 51. Hence, it is possible to improve the cooling efficiency.

2. Modification Examples

Next, modification examples (Modification Examples 1 and 2) of the above-described embodiment are described. In the following, components similar to those of the above-described embodiment are denoted with the same reference numerals, and descriptions thereof are omitted where appropriate.

2-1. Modification Example 1

FIG. 6 schematically illustrates an appearance of a cooling section 73 that configures a projection display apparatus (projector 1) according to Modification Example 1 of the present disclosure. In the cooling section 73, for example, as with the above-described embodiment, a cooling fan 730 is housed in the casing 132. It is to be noted that, for the casing 132, for example, only the space 133 in FIG. 3A is illustrated here. The cooling section 73 in the present modification example includes, as illustrated in FIG. 6, a plurality of fins 736 and 737 in positions corresponding to a duct 730D in front of an air blowing port 735 outside the casing 132. In this point, the cooling section 73 is different from the cooling fan 130 according to the above-described embodiment. The fins 736 and 737 are preferably formed to extend along the flow path F having a flow through the inside of the casing 50. This makes it possible to efficiently dissipate heat inside the casing 132 by the fins 736 and 737, thereby improving cooling performance of the cooling fan 730. It is thus possible to improve the cooling efficiency of the light conversion section 12 and to further improve the cooling efficiency of the projector 1 according to the above-described embodiment.

2-2. Modification Example 2

FIG. 7 schematically illustrates an appearance of a cooling section 83 that configures a projection display apparatus (projector 1) according to Modification Example 2 of the present disclosure. In the cooling section 83, for example, as with the above-described embodiment, the cooling fan 130 is housed in a casing 832. It is to be noted that, for the casing 832, for example, only the space 133 in FIG. 3A is illustrated here. The cooling section 83 in the present modification example is different from the above-described embodiment in that the opening 836 is provided to the casing 832 and that the opening 836 causes a portion of the cooling fan 130, for example, a surface on side opposite to side of the air inlet 131 to be exposed from the casing 832, as illustrated in FIG. 7. Causing a portion of the cooling fan 130 to be exposed to the outside in this manner makes it possible to improve cooling performance of the cooling fan 130 and thus to improve the cooling efficiency of the light conversion section 12. That is, it becomes possible to further improve the cooling efficiency of the projector 1 according to the above-described embodiment.

It is to be noted that an exposed portion 130X exposed by the opening 836 of the cooling fan 130 may include, for example, a heat dissipating member such as a heat sink attached thereto. This makes it possible to further improve the cooling performance of the cooling fan 130.

Although the technology has been described above with reference to the embodiment and the modification examples, the present technology is not limited to the above-described embodiment and the like, and may be modified in a variety of ways. Although the description has been given, specifically with reference to the components of each optical system in the above-described embodiment, not all the components may necessarily be included, and other components may be further included.

For example, although the image generation system 20 including a transmissive liquid crystal panel is described for the projector 1 illustrated in FIG. 3, an image generation system including a reflective liquid crystal panel may be adopted. It is also possible to use a digital micromirror device (DMD) or the like as the image generation element. Further, a polarization beam splitter (PBS), a color synthesizing prism that synthesizes image signals of respective colors of RGB, a total internal reflection (TIR) prism, or the like may also be used instead of the dichroic prism 232.

Furthermore, an apparatus other than the above-described projector may also be configured as the projection display apparatus according to the present technology.

Moreover, the present technology may also have the following configurations.

(1)

A projection display apparatus, including:
a light source optical system including
a light source section,
a light conversion section that converts light emitted from the light source section to light having a wavelength band different from a wavelength band of the emitted light, and
a cooling section that cools the light conversion section; and
an external casing that houses the light source optical system and has an air inlet and an air outlet that form an airflow path in a linear shape,
the light source section and the light conversion section being disposed on the airflow path, and
the cooling section being disposed at a position shifted from the airflow path.

(2)

The projection display apparatus according to (1), in which
the cooling section has a longitudinal direction in a plan view, and
the longitudinal direction of the cooling section is substantially parallel to the airflow path.

(3)

The projection display apparatus according to (1) or (2), in which
the light conversion section has a longitudinal direction in a plan view, and
the longitudinal direction of the light conversion section is orthogonal to the airflow path.

(4)

The projection display apparatus according to (2) or (3), in which
the light conversion section has a longitudinal direction in a plan view, and
the light conversion section and the cooling section are disposed to allow the respective longitudinal directions thereof to form a substantially right angle with each other.

(5)

The projection display apparatus according to any one of (2) to (4), in which
the cooling section is coupled to the light conversion section, and
the longitudinal direction of the cooling section extends from the light conversion section toward the air inlet.

(6)

The projection display apparatus according to any one of (1) to (5), in which the external casing further houses an image generation system that generates an image on the basis of light applied from the light source optical system, and a projection optical system that projects image light generated by the image generation system.

(7)

The projection display apparatus according to (6), in which the light source section of the light source optical system and the projection optical system are disposed in proximity to each other.

(8)

The projection display apparatus according to (6) or (7), in which a direction in which the light source section emits light and a direction in which the projection optical system projects the image light are equal to each other.

(9)

The projection display apparatus according to any one of (1) to (8), in which
the light conversion section is housed in a first internal casing and the cooling section is housed in a second internal casing, and
the first internal casing and the second internal casing are coupled to each other.

(10)

The projection display apparatus according to (9), in which the second internal casing is provided with a plurality of fins extending along the airflow path.

(11)

The projection display apparatus according to (10), in which the cooling section is partially exposed from the second internal casing.

(12)

The projection display apparatus according to (11), in which the cooling section includes a heat dissipating member at a location exposed from the second internal casing.

(13)

The projection display apparatus according to any one of (1) to (12), in which the cooling section includes a sirocco fan.

This application claims the benefit of Japanese Priority Patent Application JP2016-167894 filed with the Japanese Patent Office on Aug. 30, 2016, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A projection display apparatus, comprising:
a light source optical system including:
(i) a light source section,
(ii) a light conversion section that converts light emitted from the light source section to light having a wavelength band different from a wavelength band of the emitted light, and
(iii) a cooling section that cools the light conversion section; and
an external casing that houses the light source optical system and has an air inlet and an air outlet that form an airflow path in a linear shape,
the light source section and the light conversion section being disposed on the airflow path,
the cooling section being disposed at a position shifted from the airflow path, and
the cooling section being coupled to the light conversion section.

2. The projection display apparatus according to claim 1, wherein
the cooling section has a longitudinal direction in a plan view, and the longitudinal direction of the cooling section is substantially parallel to the airflow path.

3. The projection display apparatus according to claim 1, wherein
the light conversion section has a longitudinal direction in a plan view, and
the longitudinal direction of the light conversion section is orthogonal to the airflow path.

4. The projection display apparatus according to claim 2, wherein
the light conversion section has a longitudinal direction in a plan view, and
the light conversion section and the cooling section are disposed to allow the respective longitudinal directions thereof to form a substantially right angle with each other.

5. The projection display apparatus according to claim 2, wherein
the cooling section is coupled to the light conversion section, and
the longitudinal direction of the cooling section extends from the light conversion section toward the air inlet.

6. The projection display apparatus according to claim 1, wherein the external casing further houses an image generation system that generates an image on a basis of light applied from the light source optical system, and a projection optical system that projects image light generated by the image generation system.

7. The projection display apparatus according to claim 6, wherein the light source section of the light source optical system and the projection optical system are disposed in proximity to each other.

8. The projection display apparatus according to claim 6, wherein a direction in which the light source section emits light and a direction in which the projection optical system projects the image light are equal to each other.

9. The projection display apparatus according to claim 1, wherein
the light conversion section is housed in a first internal casing and the cooling section is housed in a second internal casing, and
the first internal casing and the second internal casing are coupled to each other.

10. The projection display apparatus according to claim 9, wherein the second internal casing is provided with a plurality of fins extending along the airflow path.

11. The projection display apparatus according to claim 10, wherein the cooling section is partially exposed from the second internal casing.

12. The projection display apparatus according to claim 11, wherein the cooling section includes a heat dissipating member at a location exposed from the second internal casing.

13. The projection display apparatus according to claim 1, wherein the cooling section includes a sirocco fan.

* * * * *